United States Patent
Roitman et al.

(10) Patent No.: US 6,552,488 B1
(45) Date of Patent: Apr. 22, 2003

(54) ORGANIC ELECTROLUMINESCENT DEVICE

(75) Inventors: Daniel B. Roitman, Menlo Park, CA (US); John S. Hargreaves, Mountain View, CA (US); Homer Antoniadis, Moutain View, CA (US); Karen L. Seaward, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/382,025

(22) Filed: Aug. 24, 1999

(51) Int. Cl.[7] .............................. H05B 33/06; H01J 1/62
(52) U.S. Cl. ...................... 313/512; 313/506; 313/504; 313/500; 427/58; 427/66; 427/69; 445/24
(58) Field of Search ................................ 313/500, 503, 313/504, 506, 112, 512; 445/24; 427/66, 69, 58, 67; 345/45, 76

(56) References Cited

U.S. PATENT DOCUMENTS

| | | | | |
|---|---|---|---|---|
| 4,983,469 A | * | 1/1991 | Huzino et al. | 428/690 |
| 5,598,058 A | | 1/1997 | LaPointe | 313/503 |
| 5,773,130 A | | 6/1998 | So et al. | 428/195 |
| 5,776,622 A | * | 7/1998 | Hung | 428/690 |
| 5,855,995 A | * | 1/1999 | Haq et al. | 428/210 |
| 5,902,688 A | | 5/1999 | Antoniadis et al. | 428/690 |
| 5,909,081 A | | 6/1999 | Eida et al. | 313/504 |
| 5,920,080 A | | 7/1999 | Jones | 257/40 |
| 5,981,092 A | * | 11/1999 | Arai et al. | 428/690 |
| 6,023,371 A | * | 2/2000 | Onitsuka et al. | 359/620 |
| 6,083,628 A | * | 7/2000 | Yializis | 428/463 |
| 6,198,217 B1 | * | 3/2001 | Suzuki et al. | 313/504 |
| 6,280,559 B1 | * | 8/2001 | Terada et al. | 156/295 |

FOREIGN PATENT DOCUMENTS

| | | | |
|---|---|---|---|
| JP | 6440887 | * | 2/1989 |
| WO | WO 99/03087 | | 1/1999 |

* cited by examiner

Primary Examiner—Ashok Patel

(57) ABSTRACT

A color organic electroluminescent device includes color filters, light emitting layers and substrate integrated into a single assembly, with the light emitting layers lying between the substrate and the color filters. Unlike color electroluminescent devices where an image must be viewed through a transparent substrate, or where color filters are deposited upon another device and later combined with the assembly, the present disclosure calls for a transparent protective layer of silicon nitride or a similar material to be deposited over the light emitting layers to protect the light emitting layers from oxygen and moisture, and to serve as a platform for color filters. In order to achieve sufficient density in the protective layer and avoid defects, a cold plasma deposition or similar process is used for deposition of the protective layer. By viewing light through this protective layer instead of a substrate, nearly any substrate can be used.

19 Claims, 2 Drawing Sheets

ORGANIC ELECTROLUMINESCENT DEVICE

The present invention relates to an organic electroluminescent device and, in particular, a color electroluminescent device.

BACKGROUND

Electroluminescent ("EL") devices are becoming increasingly popular as visual devices, due in-part to cheaper fabrication and longer life provided by improvements in thin-film technology. Typically, EL devices are formed of a number of transparent layers, including an EL layer which emits light when electricity flows through it. In addition to the EL layer, the devices also generally include a substrate and two electrodes on top of the substrate with the EL layer situated between the electrodes. The EL layer can be formed from either inorganic or organic EL materials, each having its own chemistries, fabrication procedures, advantages and disadvantages. EL devices are typically made to be either static or addressable; a static EL device has a single display element which is turned "on" or "off" as a single unit to present a single picture, while an addressable EL device includes separately controlled pixels which can be used to generate nearly any picture or display.

EL devices are also sometimes used for color display, but only with difficulty in the case of organic EL devices. This difficulty stems from the facts that (a) the light generating layers (electrodes and organic EL material) generally require a protective seal against moisture and oxygen before the device can be removed from a vacuum or subjected to color patterning, (b) a protective material suitable for such purpose typically uses high temperature fabrication methods in order to achieve a good density that can resist moisture and oxygen, and (c) high temperature processes generally destroy or damage organic EL materials. It would perhaps be simplest if one could deposit light generating layers (the electrodes and organic EL material) on top of a substrate, and color filters additionally on top of the light generating layers, but since the color filter patterning process often involves moving the device during fabrication, as well as use of photolithography and water based solutions, the aforementioned difficulties have generally prevented fabrication of color filters over the organic EL layers.

Two approaches have therefore generally been used for making color organic EL devices. In a first approach, color filters are first deposited upon a transparent substrate, and then are sealed and planarized. The light generating layers are then deposited over the color filters; in this case, display occurs through the transparent substrate and through the color filters. In a second approach, different organic EL materials are used to each generate specially colored light. This second approach is difficult and expensive because of processes used to deposit and pattern the different organic EL materials.

The difficulties mentioned above only increase in the case of addressable devices, since significant additional, generally more complicated patterning must be performed to separately control each of three colors within each image pixel, making it difficult to obtain high image resolution.

A need exists for an organic EL device which features color patterning on top of light generating layers. Further still, a need exists for an organic EL device which does not require use of a thin, transparent substrate (such as in the case where color filters are positioned below the light generating layers or on an opposite side of the substrate from the light generating layers); ideally, such a device would permit the use of opaque substrates or more conventional substrates. Finally, a need exists for a method of fabricating a transparent protective layer for an organic EL device which can resist moisture and support patterning or etching processes. The present invention solves these needs and provides further, related advantages.

SUMMARY

The present invention solves the aforementioned needs by providing an organic electroluminescent ("EL") device where color filters can be placed over the light generating layers, and where an opaque substrate can be used. With the present invention, a color organic EL device can be fabricated with less complication and expense, e.g., without having to use a thin, transparent substrate, and without having to use different EL materials in order to produce different colors. As should be apparent, therefore, the present invention promotes easier, less costly EL device fabrication.

One form of the present invention provides an organic EL device having a substrate, light generating layers including two electrodes and an organic EL material, and a protective layer above the light generating layers. The protective layer serves as a base above which color filters can be mounted or fabricated and is preferably created using a cold semiconductor fabrication process. "Low temperature" or "cold" as used herein means that the substrate beneath the protective layer is never heated to or above a temperature which causes significant degradation of the organic EL material; in the case of the preferred EL materials, this temperature is about one hundred and forty degrees Celsius.

Because use of some cold processes could potentially lead to defects or pinholes in the protective layer which are not moisture resistant, more detailed aspects of the invention call for fabrication of the protective layer using a conformal deposition process, preferably a plasma deposition process having a sufficiently high ratio of ions to reactive species.

Second and third forms of the invention respectively define a method and an improvement that correspond roughly to the principles outlined above.

The invention may be better understood by referring to the following detailed description, which should be read in conjunction with the accompanying drawings. The detailed description of a particular preferred embodiment, set out below to enable one to build and use one particular implementation of the invention, is not intended to limit the enumerated claims, but to serve as a particular example thereof.

BRIEF DESCRIPTION OF THE DRAWINGS

FIG. 5 shows a cross-section of a single pixel, including portions used to generate red, green and blue light through color filtration. Unlike the embodiment of FIG. 2, each pixel of a device represented by FIG. 5 includes two electrode layers 333 and 337, one of which is continuous (e.g., the cathode) and the other of which includes separately controlled pads 339 which are accessed by vias 351 in a substrate 313. FIG. 5 also shows use of an optional polymer planarization layer 159, which may be used with either of the two embodiments of FIG. 2 or 5.

FIG. 6 is a view representing multiple pixels, with each pad separately controlling a color component of an individual pixel.

DETAILED DESCRIPTION

The invention summarized above and defined by the enumerated claims may be better understood by referring to the following detailed description, which should be read in conjunction with the accompanying drawings. This detailed description of a particular preferred embodiment, set out below to enable one to build and use one particular implementation of the invention, is not intended to limit the enumerated claims, but to serve as a particular example thereof. The particular example set out below is the preferred specific implementation of an organic electroluminescent device having light generating layers positioned between color filters and substrate, and way of making such a device. The invention, however, may also be applied to other types of systems as well.

INTRODUCTION

Figure 1:
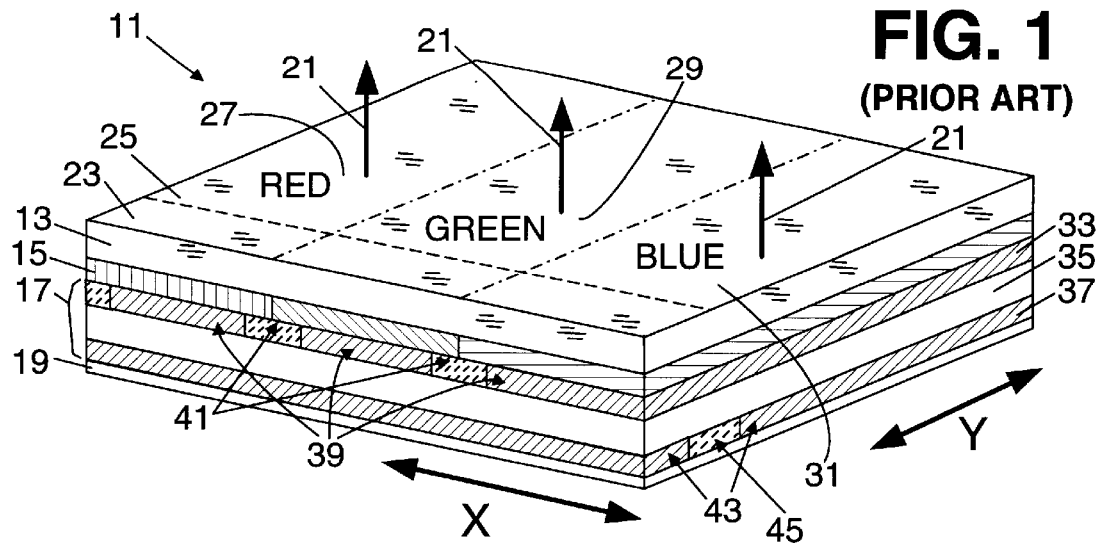
FIG. 1 illustrates slightly more than one image pixel of a prior art organic electroluminescent ("EL") device 11. In particular, part of one image pixel 23 is illustrated as well as a full, second image pixel 25 which consists of red, green and blue color generating portions 27, 29 and 31. Each pixel includes a transparent substrate 13, a planarized color filter layer 15 upon the substrate, and light generating layers 17 on top of the color filter layer.

FIG. 1 shows a conventional addressable color electroluminescent device 11, having a thin transparent substrate 13, a color filter layer 15, a set of light generating layers 17, and a cap layer 19 which permanently seals the device from moisture penetration. The color filter layer is patterned directly upon the thin transparent substrate, and is then planarized, such that the light generating layers 17 and cap layer 19 can be added directly on top of the color filter layer. Importantly, light generated by the device is viewed through the transparent substrate 13 in a direction indicated by arrows 21. This operation is typical, because the cap layer 19 is typically metallic, and is opaque and unsuitable for use as a support layer for color patterning. Each arrow 21 in FIG. 1 marks a "portion" of an image pixel, with two image pixels 23 and 25 represented and each image pixel being divided into red, green and blue light generating portions 27, 29 and 31. Each portion is separately controlled, such that any given image pixel 23 or 25 can generate any overall color using the red, green or blue components of that overall color.

The light generating layers 17 are patterned extensively in order to provide separate control over each pixel and each portion. To this effect, the light generating layers include a first electrode layer 33 which may be a cathode or anode, a continuous EL layer 35 which generally spans the entire device (i.e., all pixels of the device) and emits light when current flows through it, and a second electrode layer 37 which is the other of the cathode and anode. The EL layer actually includes anywhere from a couple to several charge transport layers, generally including an electron transport layer and hole transport layer. For present purposes, however, it suffices to state that conventional EL materials are used which emit a single color of light, generally white; otherwise stated, the EL materials are the same across all pixels and all portions of pixels, and are deposited as a single, continuous layer. The extensive patterning is performed on each of the electrode layers 33 and 37 to enable each portion to be separately controlled. As indicated in FIG. 1, the first electrode layer (which is transparent) can include a number of conductive paths 39 which pass along a "Y" dimension of FIG. 1, whereas the second, opaque electrode layer can include similar conductive paths 43 which pass along an "X" dimension of FIG. 1. It is a crisscross pattern of these paths which permits each portion to be separately controlled, e.g., by raising charge on a particular path in the first electrode layer 33 and grounding a particular path in the second electrode layer 37, one can cause current to flow in any pixel portion and thereby generate light in that portion. This type of pixel addressing is sometimes referred to as "X-Y" addressing, and is used most commonly for small size display devices; for larger displays, "active matrix" addressing is also used and will be discussed elsewhere in this disclosure. Each electrode layer 33 or 37 includes insulator portions (labeled 41 or 45, respectively), which separate adjacent electrode paths or contacts.

Another conventional prior art design similar to that seen in FIG. 1 features the color filters also placed on the substrate first, but on the opposite side of the substrate from the light generating layers; typically, in this design also, the substrate is transparent, the cap layer is opaque, and the generated light is viewed through the color filters and through the substrate.

Figure 5:
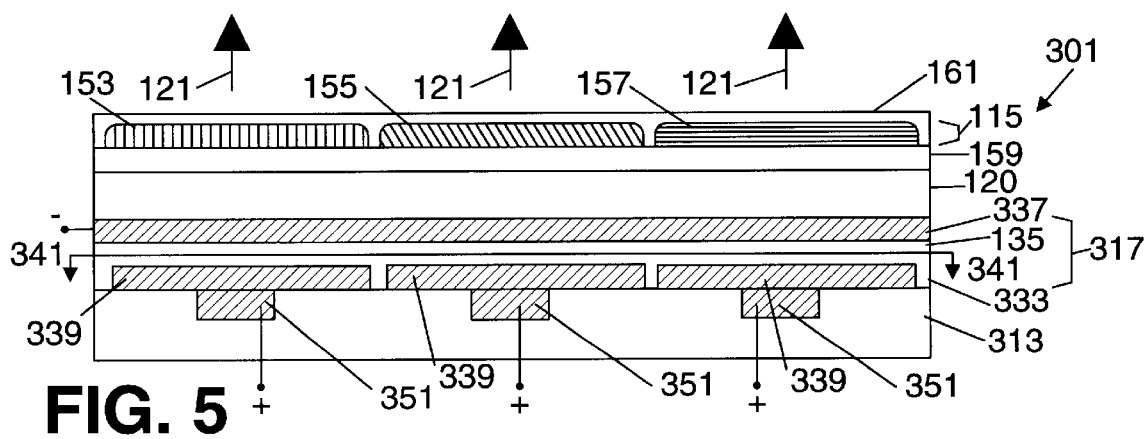
FIG. 5 shows a cross-sectional side view of the structure similar to that seen in FIG. 2, but which represents an embodiment 301 which includes the preferred electrode structure. In particular.

In contrast to these prior designs and conventional wisdom, the present invention calls for placing color filters above light generating layers, such that the light generating layers lie in between the substrate and the color filter layer; in this manner, special substrates and procedures need not be utilized, and color filters can be created directly upon the device (including the light generating layers), even with movement of the device and use of photolithography and water based solutions which are often used to create these filters. The aforementioned difficulties relating to obtaining a protective seal against moisture and oxygen are overcome using the preferred deposition methods and materials discussed herein. Organic EL devices including this seal are illustrated in FIGS. 2 and 5, which respectively indicate devices that use "X-Y" and "active matrix" addressing techniques; the latter of these embodiments is preferred.

THE LAYERS OF THE ORGANIC EL DEVICE

The preferred organic EL device is an addressable device which includes a large multitude of pixels. FIG. 2 shows a portion of such an organic EL device 151, slightly more than one pixel, which uses "X-Y" addressing. The device includes a substrate 113, a color filter layer 115, and a set of light generating layers 117 which are positioned in between the substrate and the color filter layer. Also positioned between the substrate and the color filter layer is a transparent protective layer 120, which is used to passivate the light generating layers such that the color filter layer 115 can be fabricated above already-present light generating layers 117. Notably, as indicated by arrows 121 in FIG. 2, the device is viewed in a manner such that light does not have to pass through the substrate 113, such that nearly any type of substrate can be used (e.g., more convention substrates, opaque substrates, substrates with vias, etc).

Figure 2:
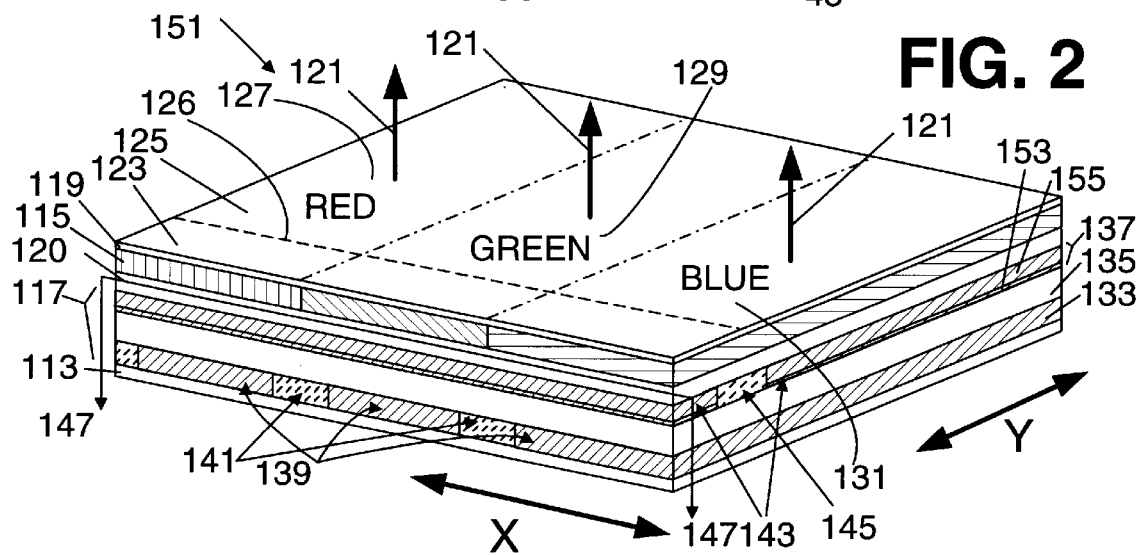
FIG. 2 illustrates one organic EL device 151, made according to the principles of the present invention. In particular, this device includes a substrate 113, light generating layers 117 positioned above the substrate, a protective layer 120 and a layer 115 of color filters deposited above the protective layer; the color filters define individual color generating portions of each pixel, e.g., red, green and blue generating portions 127, 129 and 131.
Figure 3:
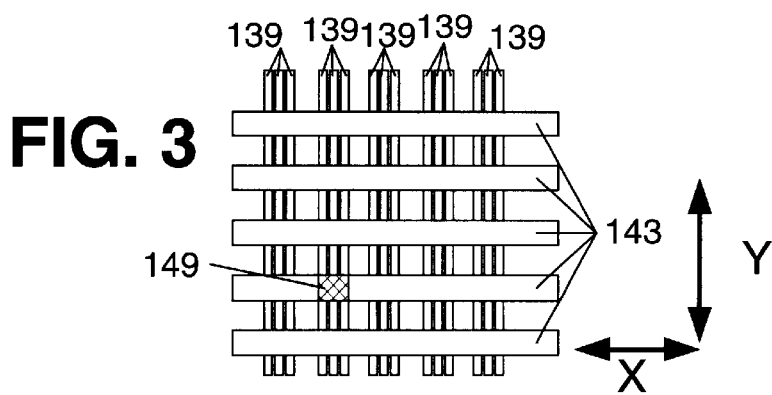
FIG. 3 illustrates a crisscross pattern of two electrode layers 133 and 135, used to illuminate select pixels in the "X-Y" addressing embodiment of FIG. 2. Each intersection of electrodes, such as intersection 149, in fact includes three electrode paths 139 which respectively control a red, green or blue color component of a single pixel.

In the embodiment of FIG. 2, the color filter layer 115 is formed above the transparent protective layer 120 (and the substrate 113 and the light generating layers 117) to enable each portion of the pixel to generate white light which is filtered to the appropriate primary color. FIG. 2 shows part of two pixels 123 and 125, each separated by a dashed line 126. In addition, three portions 127, 129 and 131 are also illustrated, one corresponding to each of red, green and blue color components. The light generating layers include a first (typically opaque) electrode layer 133 (either the anode or cathode), a continuous EL layer 135 (which typically includes several charge transport layers), and a second transparent electrode layer 137 (the other of the anode and cathode). Each electrode layer is etched into conductive paths 139 or 143, separated by insulator material 141 or 145, and together, the two electrode layers define crisscrossing rows and columns in the "X" and "Y" dimensions which are used to selectively illuminate the portions of each image pixel. This configuration is further illustrated in FIG. 3, where it is seen that each intersection (such as intersection 149) of three anode paths 139 and one cathode path 143 provides control for a single pixel. The view of FIG. 3 is taken from the perspective indicated by lines 147—147 seen in FIG. 2.

The device just described is contrasted with the use of a preferred, "active matrix" scheme, where the cathode can be configured as a single layer and the anode configured as individual pads controlled by through-substrate vias. An active matrix scheme is also contemplated by the present invention, and will be discussed below in connection with FIGS. 5 and 6.

FABRICATION METHODS

A substrate can be purchased from a commercial source and typically will be a few hundred microns thick or more. The substrate may be silicon (either doped or un-doped), silicon oxide ($SiO_x$), plastic, glass, or any other material chemically compatible with adjacent layers and sufficiently mechanically robust to support the light generating and other layers. If desired for the preferred embodiment, the substrate can be purchased with a metal layer directly upon it for direct use as one of the electrodes (e.g., in the case of static EL devices) or for patterning for use as an addressable device. When the first electrode layer is an anode, it comprises a reflective metal having a high work function, preferably greater than about 4 or 4.5 eV. The metal can be chosen to include platinum, palladium, iridium, gold, tungsten, nickel, silver or aluminum. Conventional techniques, such as photolithographic techniques, are used to mask, etch and pattern the individual conductive paths within this layer.

On top of the first electrode layer, there may be an optional conductive layer; this optional layer is especially useful when the first electrode layer is selected to be a material not compatible with the substrate and the organic EL layers, or does not have an appropriate work function. The optional layer can be formed of, for example, ITO, indium zinc oxide, tin oxide, magnesium indium oxide, or nickel tungsten oxide. Conducting nitride materials such as titanium nitride (TiN), or semitransparent conducting NiO, may also be used (the use of TiN is described in a publication of Wakefield et al., (*Semicond. Sci. Technol.* Vol. 12, pg. 1304 (1997)).

Once patterning of the first electrode layer using these techniques is complete, the organic EL layer is then formed from two or more material layers (not separately illustrated in FIG. 2 or 5), generally including a hole transport layer and an electron transport layer. The hole transport layer may comprise any suitable conductor of holes, such as 4-4'-Bis [N-(1-naphthyl)-N-phenylamino]-biphenyl (NPB), 4,4',4"-tris{N(3-methyl-phenyl)-N-phenylamino} triphenylamine (m-MTDATA), conducting polyaniline (Pani), polyethylenedioxy-thiophene-polystyrenesulfonate (PEDOT:PSS), thiophenes, metal-base or metal-free phthalocyanines, and many other suitable materials that will be known to those of ordinary skill in the art; a large number of suitable hole transport materials are disclosed in International Patent Application WO 99/20081. The electron transport layer may be formed of aluminum trihydroxyquinoline ($Alq_3$), or electroluminescent polymers known in the art such as poly(phenylene vinylene) (PPV), polyfluorenes, or derivatives or copolymers of these polymers. A number of materials having suitable electron transport and emissions properties are described in U.S. Pat. Nos. 5,608,287, 5,708, 130, 5,776,623, and 5,777,070, which are incorporated herein by reference. As will be apparent to those of ordinary skill in the art, these layers may also sandwich another layer between them for generating electroluminescence. The EL layer and its constituent materials may be deposited by any of a number of processes, depending on the organic EL materials used and the first electrode materials; for example, thermal vacuum evaporation coating, spin coating, dip coating, doctor-blading, roll-coating, injection-fill, embossing, stamping, physical or chemical vapor deposition, and other techniques known to those skilled in the art may generally be used to deposit these materials.

Once the organic EL layer is deposited, the second transparent electrode layer (e.g., the cathode) is deposited and patterned preferably using shadow masking techniques. Since this electrode layer must conduct electricity, and since metals are generally opaque, this second layer should be specially composed in order to perform its functions. For example, the second electrode layer may be an alkali, alkaline earth or rare earth metal, the work function of which should be lower or equal to energy of the lowest unoccupied molecular orbital (LUMO) of the electron transport organic EL layer. Alternatively, the second transparent electrode layer may be composed of two separate material layers including a thin, electron injection layer 153 and a transparent capping material 155, illustrated in FIG. 2. In this event, the electron injection layer may be formed a very thin transparent metal layer and be followed by a less conductive transparent capping layer such as a conductive oxide or ITO.

Further details and methods for forming the various electrode and EL layers are described in U.S. patent application Ser. No. 09/353,709, filed on Jul. 14, 1999 on behalf of inventors Daniel B. Roitman and Romer Antoniadis for "Organic Light Emitting Diodes and Method For Making Same," and in International Patent Application WO 99/20081, which are hereby incorporated by reference as though fully set forth herein. Generally, no matter which materials are used, care needs to be taken throughout the process and after the process to avoid degradation of the cathode and light-emitting layers by moisture and oxygen.

The transparent protective layer is then applied typically using a different deposition process, and a prefabricated assembly of substrate and the light generating layers are transported to a second deposition apparatus as necessary. For example, the assembly can be transported in a load lock device between deposition chambers, or by another transport mechanism which minimizes exposure to oxygen and moisture (e.g., transport in a sealed container containing a desiccant). The protective layer is preferably Silicon Nitride and is deposited to a thickness of between a few hundred Angstroms to a micron using a deposition process that will be described further below. Conventionally, deposition of this material would be performed using semiconductor fabrication equipment at 300 degrees Celsius, but such would damage or destroy most EL materials which typically do not survive temperatures of 140–160 degrees Celsius and above. The preferred deposition apparatus therefore is a modified commercially available device which employs a "cool" dielectric semiconductor deposition process, i.e., one where the substrate is never heated above this temperature. Since some cold processes may yield materials that are not suitably dense for reliable use in preventing moisture penetration, the preferred deposition process is a plasma deposition apparatus that yields a dense protective layer. Other materials can also be used to form the protective layer, such as an aluminum oxide, silicon oxynitride or silicon dioxide.

Figure 4:
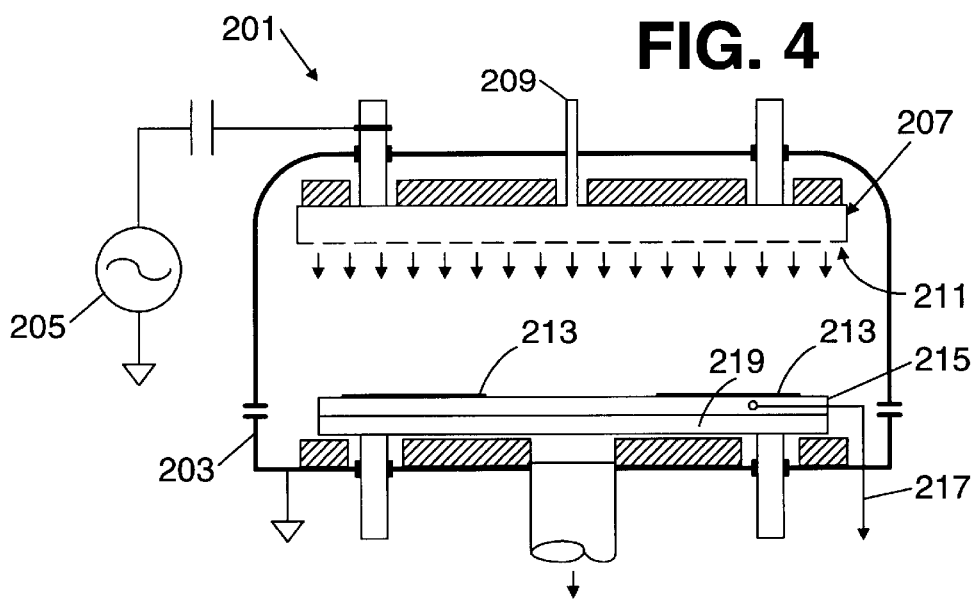
FIG. 4 is a basic schematic diagram showing one version of a deposition process used in making the preferred organic EL device.

As seen in FIG. 4, one type of deposition apparatus 201 for the transparent protective layer includes a chamber 203, a high frequency generator 205, and a plasma source 207. The plasma source receives gas from an inlet 209 and ejects ions and reactive species 35 through a grating 211 toward substrate assemblies 213. The substrate assemblies are supported by a pad 215, which includes a thermocouple output 217 used to measure substrate temperature. Beneath the pad is a heating/cooling unit 219 which is modified as necessary from commercially available deposition apparatuses in order to provide heat not exceeding 140 degrees Celsius. Preferably, the thermocouple output is used in a control feedback loop to monitor this temperature. If desired, the heating/cooling unit may also be used to cool the substrates during deposition.

A goal of the deposition parameters and equipment is obtaining films which are compressive in nature, and not tensile, as this tends to reduce cracking which would lead to moisture and oxygen permeability. Generally, plasma deposition apparatuses may be divided into low density plasma devices (roughly $10^9$–$10^{10}$ ions per cubic centimeter) and high density plasma devices (having $10^{10}$–$10^{12}$ ions per cubic centimeter, or more). The low density devices tend to produce a ratio of ions to reactives of about 1 in 10,000, whereas the high density devices may produce a ratio of ions to reactives of 1 in 100 or more. Empirically speaking, it has been found that the high density plasma device can produce an acceptably dense silicon nitride protective layer at low temperatures, whereas experiments with low density plasma devices have tended to produce layers which are relatively more porous to moisture and oxygen.

FIG. 5 provides a view of an organic EL device 301 similar to that seen in FIG. 2, but where preferred "active matrix" addressing is used to control pixels illumination. In FIG. 5, it is seen that the display is again viewed in the direction indicated by arrows 121 and not through a substrate 313. In this particular case, the light emitting layers 317 are again mounted above the substrate 313, with the transparent protective layer 120 and color filter layer 115 again mounted above the light emitting layers; attention has not been paid to the relative dimensions depicted in FIG. 5, which may be imprecise. Nevertheless, FIG. 5 illustrates the use of active matrix addressing, where the first electrode layer 333 (e.g., the anode) is configured as individual pads 339 above the substrate; each pad 339 is electrically connected to individual vias 351 within the opaque substrate for charge transport. Since the substrate 313 in this embodiment need not be transparent, it should be relatively easy to use conventional, generally opaque, commercially available substrates having these vias.

FIG. 5 shows in additional detail the use of individual color filters 153, 155 and 157, which are respectively hatched differently to indicate the preferred use of red, green and blue shades; other colors may also be used. FIG. 5 also shows use of an optional polymer planarization layer 159, placed immediately over the protective layer 120; this polymer planarization layer can be formed by applying a monomer solution to the surface of the protective layer, which is then exposed to an ultraviolet light source to cross-link the monomers. Deposition of a polymer planarization layer 159 is not critical to the present invention, and its formation is considered as readily understood by one skilled in the arts of thin films or EL devices; the use of such a layer may be considered advisable, because the layer does yield an especially smooth surface for the color filters 153, 155 and 157, but it is not used in the preferred embodiment for simplicity in manufacture.

The color filters 153, 155 and 157 are produced via a photolithographic process. To this effect, a photoresist mask layer is first placed in contact with the device and exposed and washed, to leave exposed photoresist to mask desired areas of the device. Then, a solution of one of the color filter materials is then evaporated on the device. Finally, the photoresist material is removed, leaving a desired color filter overlying certain parts of the device, and the entire process is repeated for each additional color filter.

Once fabrication of the color filters has been completed, the entire assembly is sealed using a protective material layer 161 such as adhesives and glass, or some other impermeable transparent barrier, for example, one formed by transparent $SiN_x$ or $SiO_x$. This layer serves to insulate all internal layers from moisture and oxygen which might otherwise detract from the device's useful life.

Figure 6:
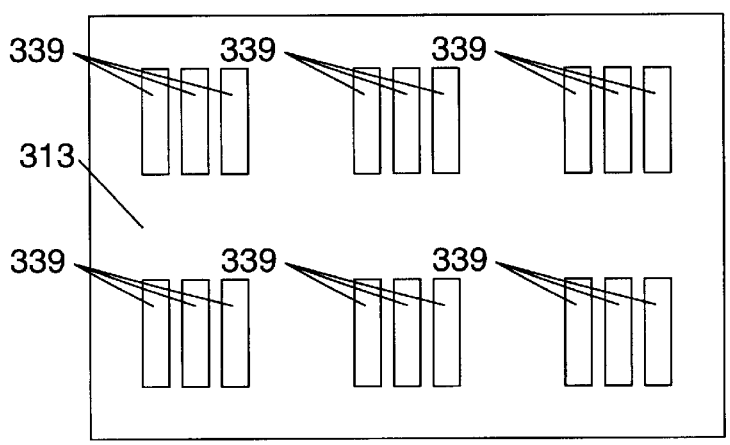
FIG. 6 is a view similar to FIG. 3, but which shows the use of separately controlled pads 339 which are electrically accessed through and within a substrate 313.

FIG. 6 illustrates in additional detail the active matrix addressing, and should be taken in contrast with the conductive path arrangement indicated in FIG. 3. In particular, FIG. 6 is taken from the perspective of lines 341—341 of FIG. 5, but instead shows the patterning of the first electrode layer for each of multiple pixels; each pixel includes a set of three electrode pads 339 mounted above the substrate 313 in order to cause current to flow. The relative sizes and geometries of FIG. 6 are imprecise, and in practice, the electrode pads 339 and pixels represented by each group of three pads will be closer together than illustrated. Also, a conventional device will include many more than the six pixels represented by the pads 339 of FIG. 6.

Having thus described several exemplary implementations of the invention, it will be apparent that various alterations, modifications, and improvements will readily occur to those skilled in the art. Such alterations, modifications, and improvements, though not expressly described above, are nonetheless intended and implied to be within the spirit and scope of the invention. Accordingly, the foregoing discussion is intended to be illustrative only; the invention is limited and defined only by the following claims and equivalents thereto.

What is claimed is:

1. In an organic electroluminescent device having a substrate, light emitting layers on top of the substrate, the light emitting layers including two electrode layers and an organic electroluminescent material therebetween, and at least one color filter, an improvement comprising:

creating a transparent protective layer on top of the light emitting layers, such that the light emitting layers lie between the substrate and the transparent protective layer; and layering the color filter above the transparent protective layer, such that both the light emitting layers and the transparent protective layer lie in between the substrate and the color filter.

2. An improvement according to claim 1, wherein the transparent protective layer is impermeable to moisture.

3. An improvement according to claim 1, wherein the transparent protective layer comprises a layer of material chosen from the group consisting of aluminum dioxide, silicon dioxide, silicon oxynitride and silicon nitride, the layer being sufficiently dense to prevent moisture from passing therethrough.

4. An improvement according to claim 1, wherein the device comprises an addressable organic electroluminescent device.

5. An improvement according to claim 4, wherein the addressable organic electroluminescent device utilizes active matrix addressing.

6. An improvement according to claim 1, further comprising:
    forming the device to be an organic electroluminescent device that generates a single color of light;
    layering at least two color filters above the protective layer, each of the at least two color filters generating a color component of light from the single color.

7. An improvement according to claim 6, wherein the single color of light is white light.

8. An improvement according to claim 1, wherein the substrate is opaque.

9. An improvement according to claim 8, wherein the opaque substrate comprises internal vias for electrical connection.

10. An improvement according to claim 1, wherein the protective layer is between five hundred Angstroms and one micron in thickness.

11. An organic electroluminescent device, comprising:
    a substrate;
    a first electrode above the substrate, the first electrode being one of a cathode and an anode;
    an organic electroluminescent material layer above the first electrode;
    a second, transparent electrode above the organic electroluminescent layer, the second, transparent electrode being the other of the cathode and the anode;
    a transparent protective layer above the second, transparent electrode; and
    at least one color filter above the protective layer.

12. A device according to claim 11, wherein the transparent protective layer includes one of silicon nitride, aluminum dioxide and silicon dioxide, and has a density sufficient to prevent moisture from passing therethrough.

13. A device according to claim 11, wherein the device is an addressable electroluminescent device having multiple pixels and generates a single color of light, each pixel including at least two portions that each produce light of different colors from the single color, said device further comprising at least two color filters per pixel, the color filters positioned above the protective layer and side by side such that the first portion includes one color filter that generates a first color from the single color, and the second portion includes another color filter and generates a second, different color of light from the single color.

14. A device according to claim 13, wherein each color filter produces a primary color of light.

15. A device according to claim 11, wherein the transparent protective layer is substantially silicon nitride and has a thickness of between five hundred Angstroms and one micron.

16. A method of creating an organic electroluminescent device, using a substrate, light emitting layers including two electrodes and an organic electroluminescent material, a color filter and a transparent protective layer, said method comprising:
    depositing the light emitting layers above the substrate;
    creating the transparent protective layer above the light emitting layers, such that the light emitting layers are between the transparent protective layer and the substrate; and
    layering the color filter above the protective layer, such that the light emitting layers and the protective layer are between the color filter and the substrate.

17. A method according to claim 16, wherein the organic electroluminescent material produces white light and wherein:
    layering the color filter includes placing at least three separate color filters above the protective layer, such that each color filter produces light of a primary color by filtering light from the white light.

18. A method of creating an organic electroluminescent device, using a substrate, light emitting layers including two electrodes and an organic electroluminescent material, a color filter and a transparent protective layer, said method comprising:
    depositing the light emitting layers above the substrate,
    creating the transparent protective layer above the light emitting layers, such that the light emitting layers are between the transparent protective layer and the substrate; and
    layering the color filter above the protective layer, such that the light emitting layers and the protective layer are between the color filter and the substrate, wherein, creating the transparent protective layer includes depositing the transparent protective layer using a deposition process upon the device including the organic electroluminescent material, but where the device is not heated above one hundred and forty degrees Celsius.

19. A method according to claim 18, wherein the deposition process is a plasma deposition process.

* * * * *